(12) United States Patent
Kobayashi

(10) Patent No.: US 8,927,871 B2
(45) Date of Patent: Jan. 6, 2015

(54) CONNECTION TERMINAL STRUCTURE, INTERPOSER, AND SOCKET

(71) Applicant: Shinko Electric Industries Co., Ltd., Nagano (JP)

(72) Inventor: Tomoki Kobayashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 13/920,204

(22) Filed: Jun. 18, 2013

(65) Prior Publication Data

US 2013/0344718 A1 Dec. 26, 2013

(30) Foreign Application Priority Data

Jun. 22, 2012 (JP) ................ 2012-141331

(51) Int. Cl.
| | | |
|---|---|---|
| *H01R 12/70* | (2011.01) | |
| *H01R 12/57* | (2011.01) | |
| *H01R 13/24* | (2006.01) | |
| *H05K 7/10* | (2006.01) | |

(52) U.S. Cl.
CPC .............. *H01R 12/70* (2013.01); *H01R 12/57* (2013.01); *H01R 13/2435* (2013.01); *H05K 7/1069* (2013.01)
USPC ........................................................ 174/250

(58) Field of Classification Search
CPC ....... H05K 1/18; H05K 1/14; H05K 2201/10; H05K 1/0213; H05K 1/144; H05K 3/326; H05K 3/40; H05K 3/34; H05K 1/11; H05K 7/1468; H05K 2201/09209; H05K 2201/10378; H05K 2201/10719; H05K 2201/10742; H05K 2201/10757; H05K 2201/10924; H01R 4/28

See application file for complete search history.

(56) References Cited

U.S. PATENT DOCUMENTS

| | | | |
|---|---|---|---|
| 6,702,594 B2 * | 3/2004 | Lee et al. ................... | 439/83 |
| 8,179,692 B2 | 5/2012 | Ihara | |
| 2005/0161802 A1 * | 7/2005 | Hosoya .................... | 257/696 |
| 2008/0239683 A1 * | 10/2008 | Brodsky et al. ............ | 361/760 |
| 2010/0300742 A1 * | 12/2010 | Ihara et al. ................ | 174/261 |
| 2011/0300746 A1 * | 12/2011 | Ihara ........................ | 439/571 |

FOREIGN PATENT DOCUMENTS

| | | | | |
|---|---|---|---|---|
| JP | 2011-014451 | | 1/2011 | |
| WO | WO 2009082734 A1 * | | 7/2009 | ............ H01R 4/02 |

* cited by examiner

*Primary Examiner* — Timothy Thompson
*Assistant Examiner* — Michael F McAllister
(74) *Attorney, Agent, or Firm* — IPUSA, PLLC

(57) ABSTRACT

A connection terminal structure includes a substrate having one surface and including a pad formed on the one surface, a bonding part constituted by a solder, and a connection terminal having first and second ends and including a fixing part formed on the first end and a connection part formed on the second end. The fixing part includes a first surface that is bonded to the pad by way of the bonding part. The connection terminal includes a pad facing surface that faces the pad and includes the first surface. The connection terminal includes at least one groove that is formed in the pad facing surface. The at least one groove extends from the first surface to the connection part. A portion of the solder that constitutes the bonding part fills in the at least one groove.

12 Claims, 12 Drawing Sheets

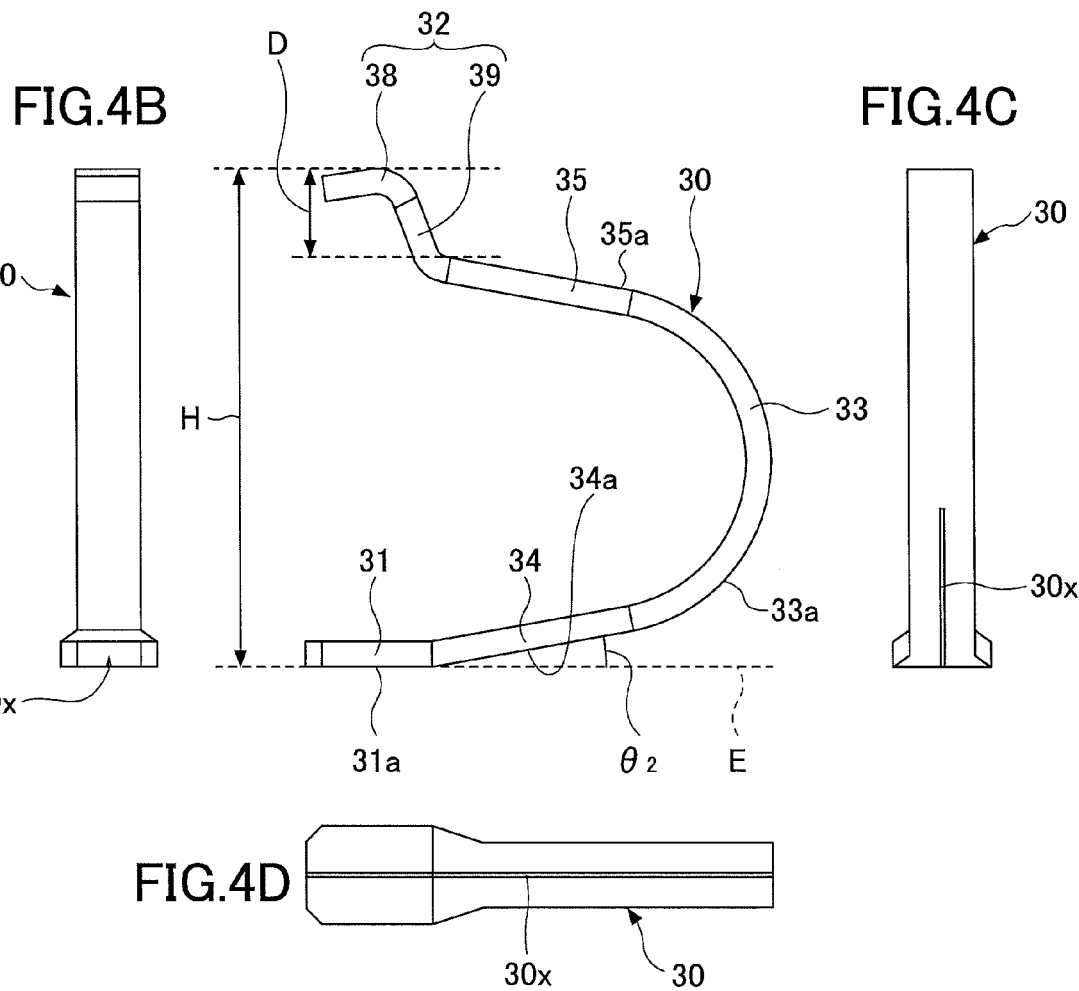

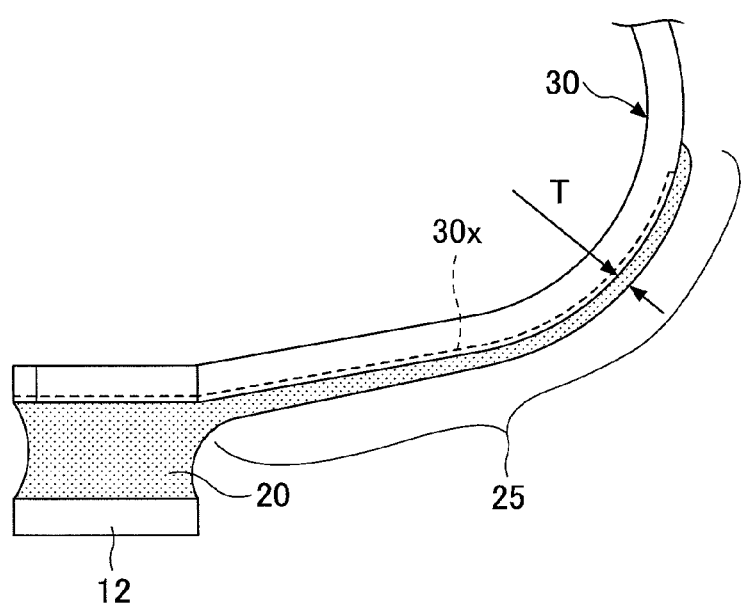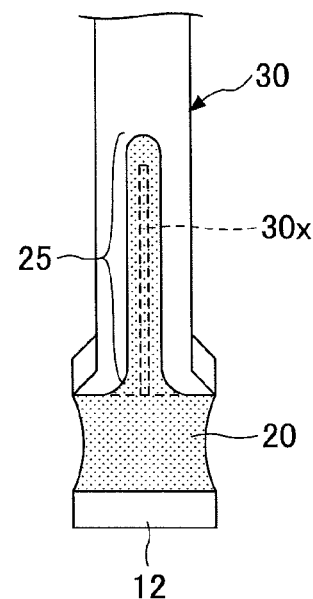

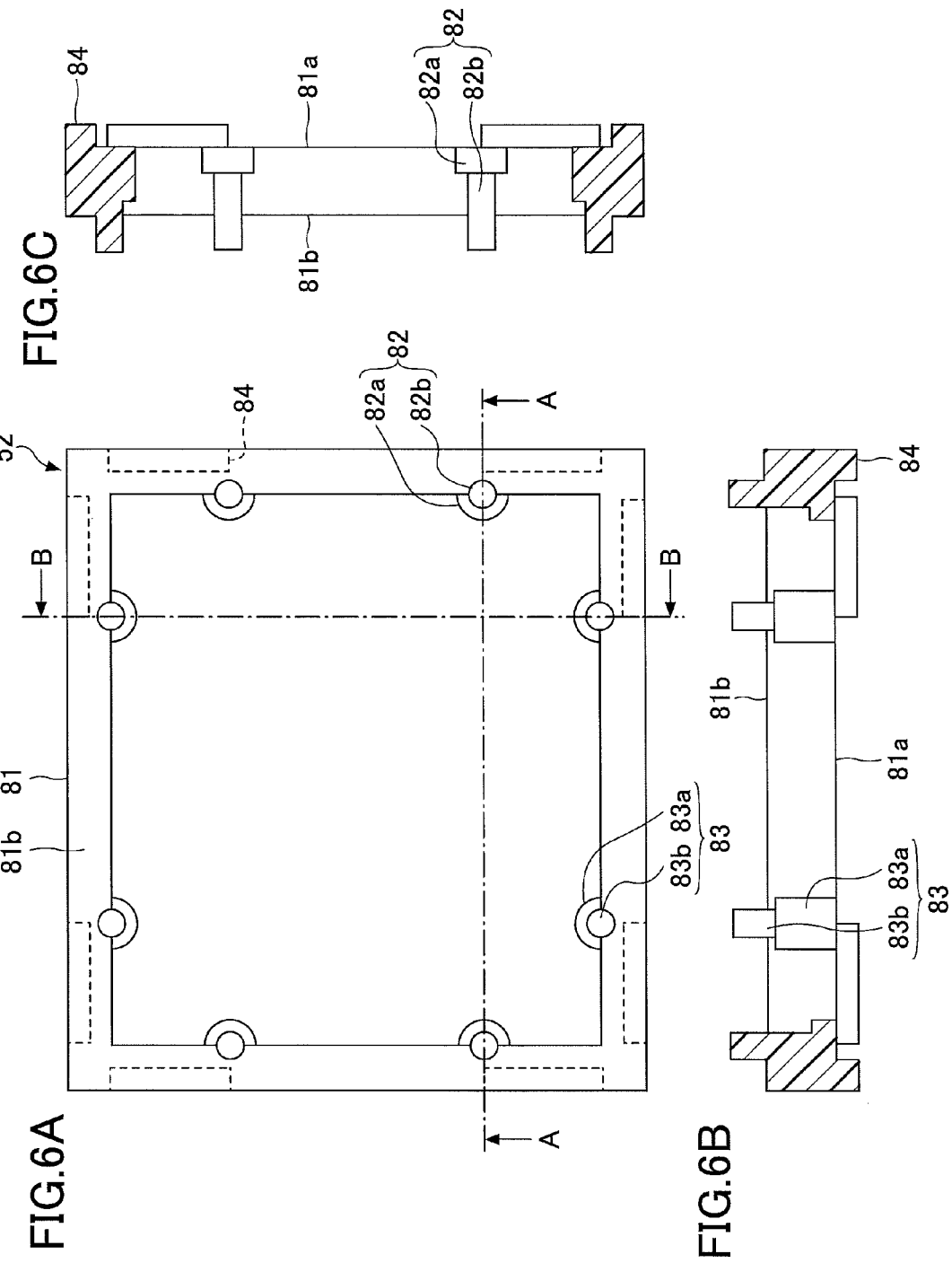

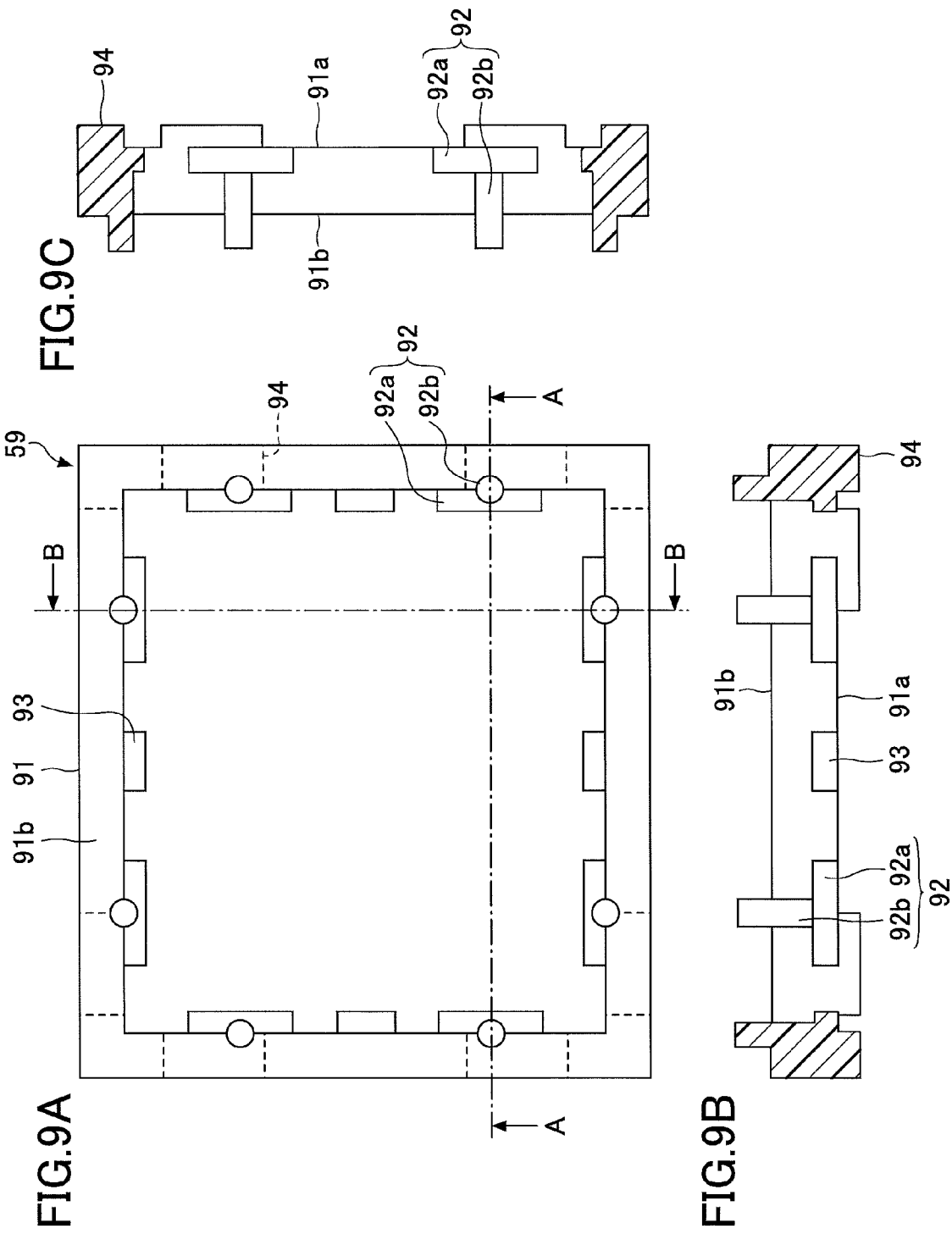

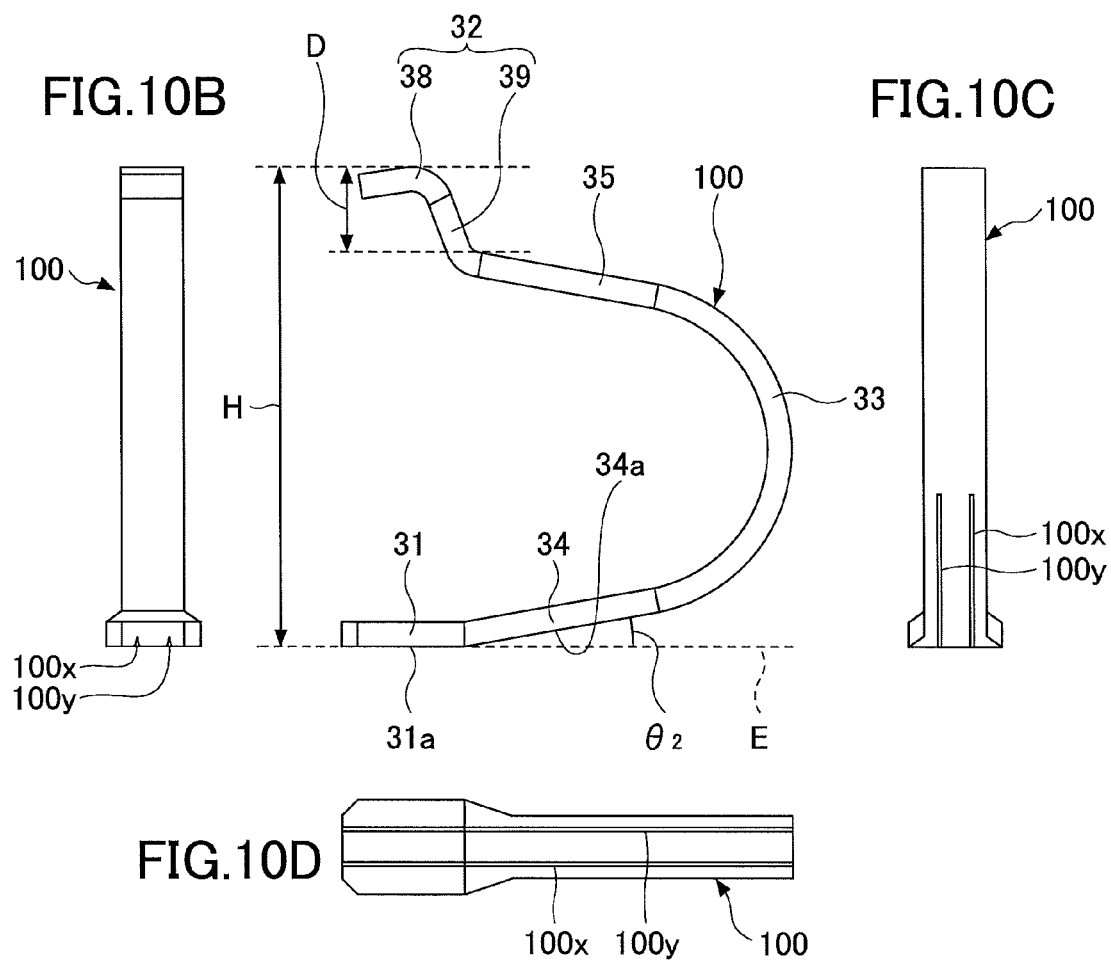

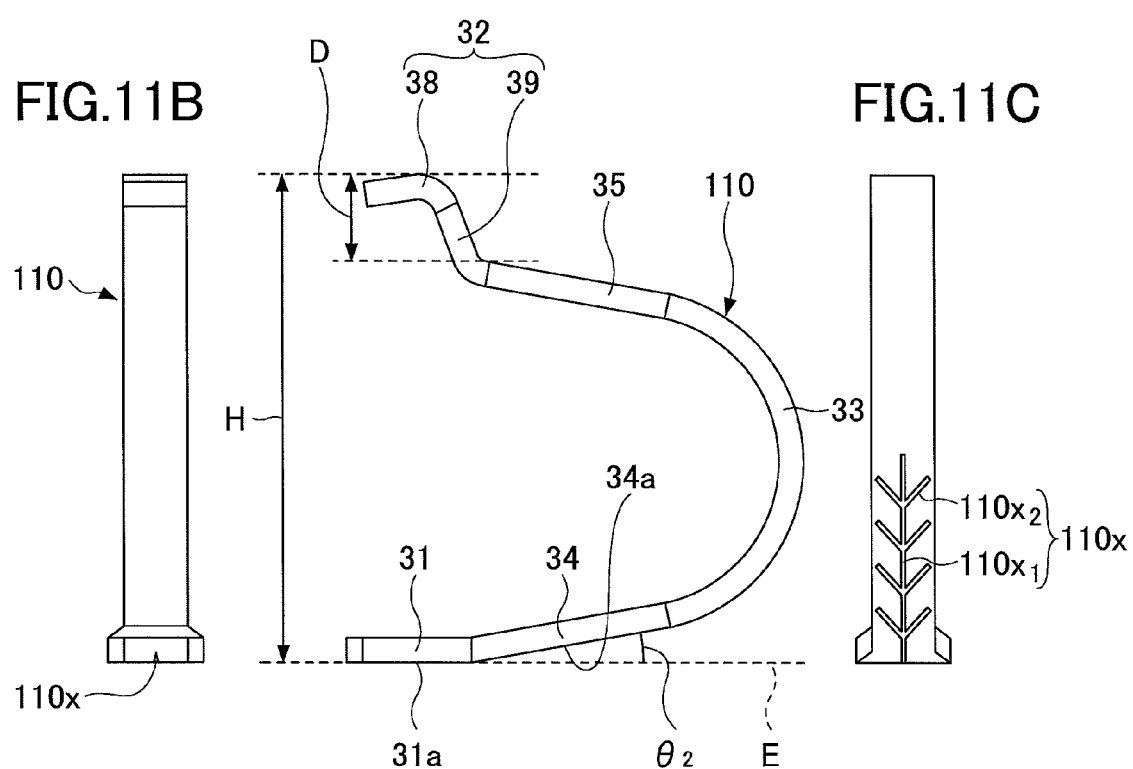

CONNECTION TERMINAL STRUCTURE, INTERPOSER, AND SOCKET

CROSS-REFERENCE TO RELATED APPLICATIONS

This application is based upon and claims the benefit of priority of the prior Japanese Patent Application No. 2012-141331 filed on Jun. 22, 2012, the entire contents of which are incorporated herein by reference.

FIELD

The embodiments discussed herein are related to a connection terminal structure, an interposer, and a socket.

BACKGROUND

Conventionally, there is known a connection terminal structure in which a connection terminal having a spring-like property is bonded to a pad of a substrate (see, for example, Japanese Laid-Open Patent Publication No. 2011-014451). In the connection terminal structure, an upper surface of the pad (hereinafter also referred to as "pad upper surface") of the substrate is bonded, by way of solder, to a surface of the connection terminal that faces the pad upper surface (pad facing surface).

However, the solder not only adheres to an area between the pad upper surface of the substrate and the pad facing surface of the connection terminal but also adheres to a surface of a part of the connection terminal (extending surface) that extends from the pad facing surface. That is, residual solder that is wetted and spreads from the area between the pad upper surface and the pad facing surface may adhere to the extending surface of the connection terminal. The amount and shape of the residual solder adhered to the extending surface of the connection terminal are not uniform and may vary with respect to each connection terminal.

The varying of the amount and shape of the residual shape may lead to inconsistencies among the connection terminals. For example, the spring constant of each connection terminal or the height between a surface of the substrate and a tip of the connection terminal may vary. This may lead to degradation of connection reliability between the connection terminal and a connection target.

SUMMARY

According to an aspect of the invention, there is provided a connection terminal structure including: a substrate having one surface and including a pad formed on the one surface; a bonding part constituted by a solder; and a connection terminal having first and second ends and including a fixing part formed on the first end and a connection part formed on the second end; wherein the fixing part includes a first surface that is bonded to the pad by way of the bonding part, wherein the connection terminal includes a pad facing surface that faces the pad and includes the first surface, wherein the connection terminal includes at least one groove that is formed in the pad facing surface, wherein the at least one groove extends from the first surface to the connection part, wherein a portion of the solder that constitutes the bonding part fills in the at least one groove.

The object and advantages of the invention will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIG. 4A is a front view of a connection terminal according to the first embodiment;

FIG. 4B is a left side view of a connection terminal according to the first embodiment;

FIG. 4C is a right side view of a connection terminal according to the first embodiment;

FIG. 4D is a bottom view of a connection terminal according to the first embodiment;

FIGS. 5A and 5B are schematic diagrams for describing a residual solder part according to an embodiment of the present invention;

FIG. 6A is a plan view of a positioning part according to the first embodiment;

FIG. 6B is a cross-sectional view taken along line A-A of FIG. 6A according to the first embodiment;

FIG. 6C is a cross-sectional view taken along line B-B of FIG. 6A according to the first embodiment;

FIG. 9A is a plan view of a positioning part according to the second embodiment;

FIG. 9B is a cross-sectional view taken along line A-A of FIG. 9A according to the second embodiment;

FIG. 9C is a cross-sectional view taken along line B-B of FIG. 9A according to the second embodiment;

FIG. 10A is a front view of a connection terminal of a first modified example;

FIG. 10B is a left side view of a connection terminal of the first modified example;

FIG. 10C is a right side view of a connection terminal of the first modified example;

FIG. 10D is a bottom view of a connection terminal of the first modified example;

FIG. 11A is a front view of a connection terminal of a second modified example;

FIG. 11B is a left side view of a connection terminal of the second modified example;

FIG. 11C is a right side view of a connection terminal of the second modified example;

FIG. 11D is a bottom view of a connection terminal of the second modified example;

DESCRIPTION OF EMBODIMENTS

Figure 1:
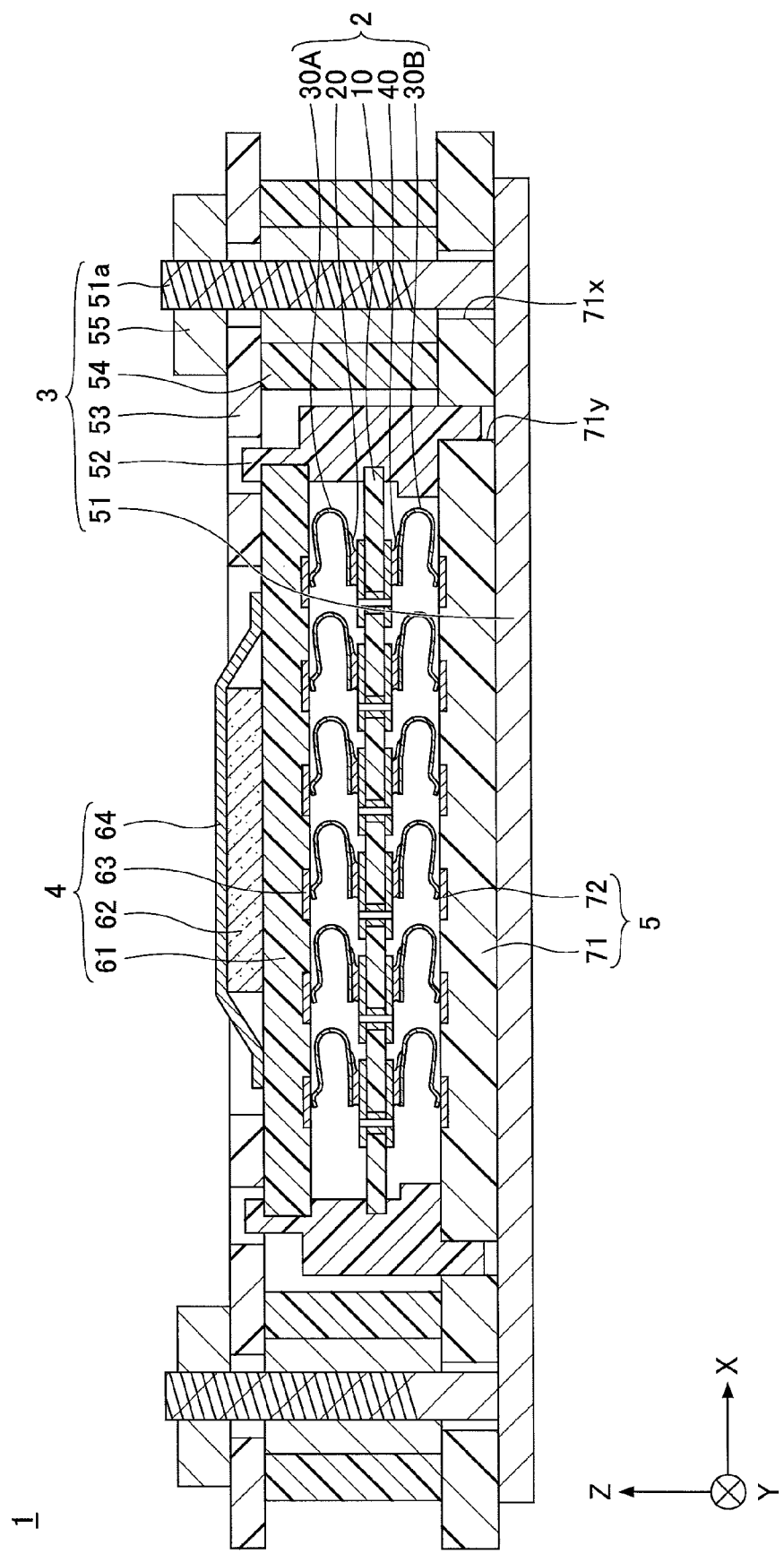
FIG. 1 is a cross-sectional view illustrating an example of a socket according to a first embodiment.

In the following, illustrative embodiments of the present invention are described with reference to the accompanying drawings. Throughout the drawings, like components/parts may be denoted with like reference numerals and further description thereof may be omitted.

Although the following embodiments describe a semiconductor package and a substrate that have rectangular shapes from a plan view, the plan view shapes of the semiconductor package and the substrate are not limited to a rectangle but may be other shapes.

(First Embodiment)

Figure 2:
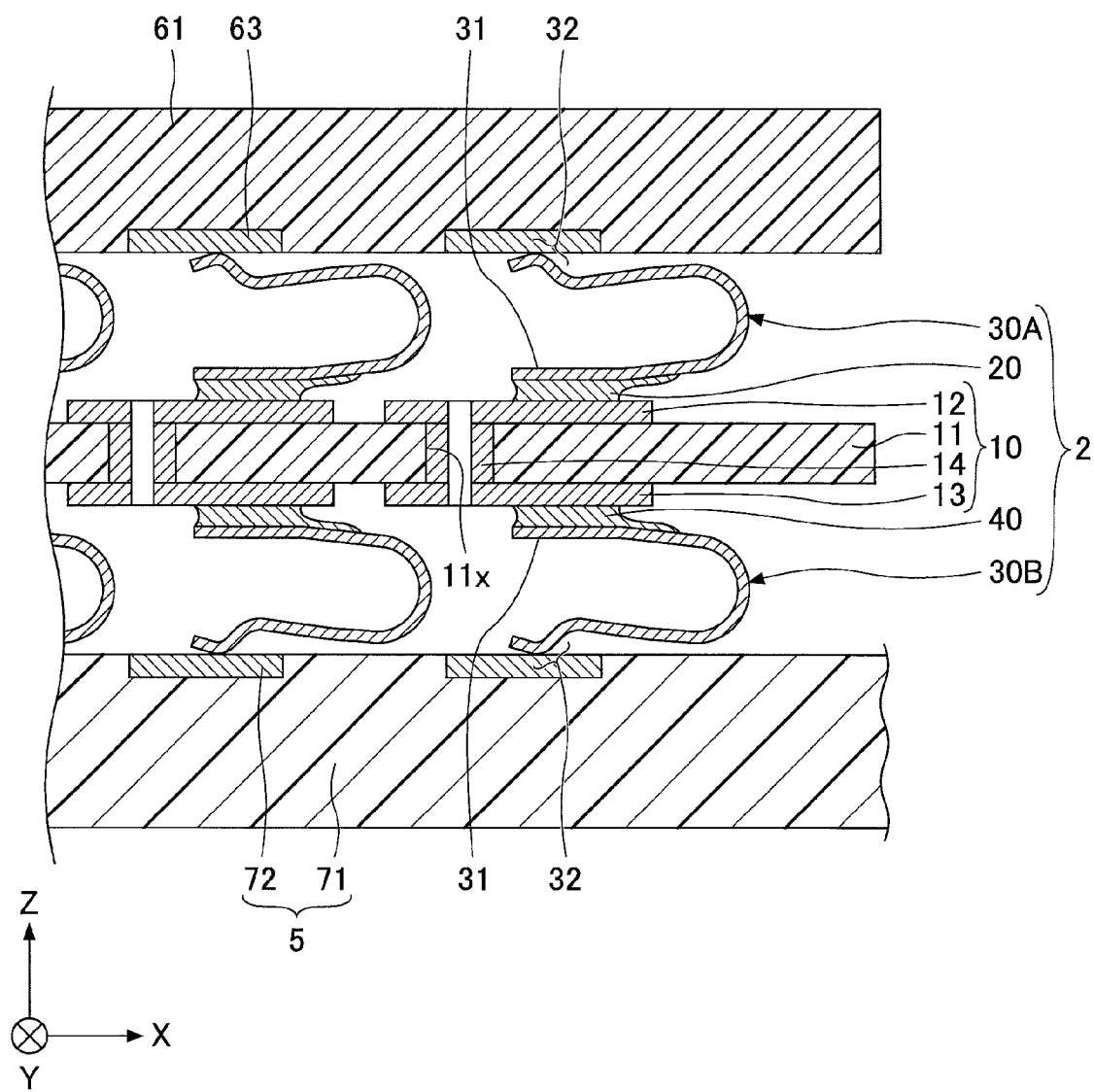
FIG. 2 is an enlarged view of a portion of FIG. 1.
Figure 3:
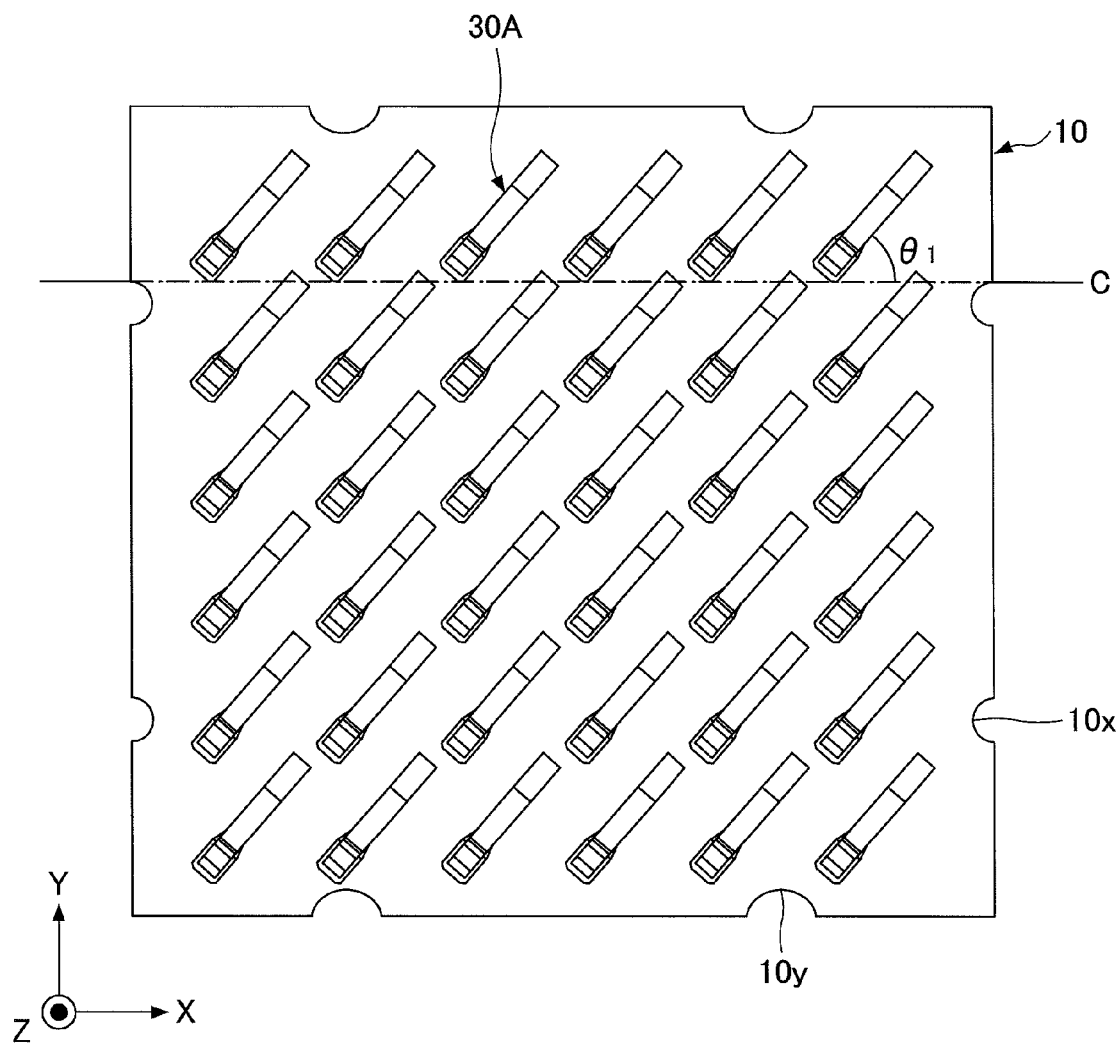
FIG. 3 is a plan view illustrating an example of an arrangement of connection terminals illustrated in FIG. 1.

FIG. 1 is a cross-sectional view illustrating an example of a socket 1 according to a first embodiment of the present invention. FIG. 2 is an enlarged view of a portion of FIG. 1. FIG. 3 is a plan view illustrating an example of an arrangement of connection terminals 30 (30A, 30B) illustrated in FIG. 1. In FIGS. 1 to 3, an X-direction indicates a direction in which the connection terminals 30 are arranged, a Y-direction indicates a direction that is orthogonal to the X-direction and parallel to one surface of the substrate body 11, and a Z-direction indicates a direction that is orthogonal to the one surface of the substrate body 11. Further, FIGS. 1 and 2 illustrate cross sections that are parallel to an X-Z plane of FIG. 3. FIG. 3 illustrates only a substrate 10 and the connection terminals 30A.

As illustrated in FIG. 3, because the connection terminals 30 are inclined toward the X-direction from a plan view (i.e. when viewed from the Z-direction), the cross sections of the connection terminals 30, normally, cannot be illustrated with cross-sectional views that are parallel to the X-Z plane of FIG. 3. However, for the sake of convenience, FIGS. 1 and 2 schematically illustrate the cross sections of the connection terminals 30 (which would normally not appear in cross sections that are parallel to the X-Z plane of FIG. 3).

With reference to FIGS. 1 to 3, the socket 1 includes an interposer 2 and a retaining structure 3. A semiconductor package 4, which is in a detachably attached state with a mounting substrate 5, is electrically connected to the mounting substrate 5 by using the socket 1. Although the semiconductor package 4 is a connection target according to the first embodiment, the connection target may be a wiring substrate including no semiconductor chip may be used as a connection target.

It is to be noted that, for the sake of convenience, a surface positioned toward an upper side of FIG. 1 (side of below-described pressing plate 53) may be described as "one surface" or "upper surface" whereas a surface positioned toward a lower side of FIG. 1 (side of below-described rear fixing plate 51) may be described as "other surface", "another surface" or "lower surface".

(Interposer 2)

First, the interposer 2 included in the socket 1 is described. The interposer 2 includes the substrate 10, a bonding part 20, connection terminals 30A, 30B, and a bonding part 40. Because the connection terminal 30A and the connection terminal 30B have the same structure, the connectional terminal 30A and the connection terminal 30B may also be collectively referred to as "connection terminal 30" in a case where the connectional terminal 30A and the connection terminal 30B do not need to be distinguished from each other.

The substrate 10 includes: the substrate body 11; a pad 12 that is formed on a one surface of the substrate body 11; a pad 13 that is formed on another surface of the substrate body 11; and a through wiring 14 formed in a through hole 11x penetrating the substrate body 11 from the one surface of the substrate body 11 to the other surface of the substrate body 11. In addition, a solder resist layer that selectively exposes the pad 12 may be formed on the one surface of the substrate body 11. Further, a solder resist layer that selectively exposes the pad 13 may be formed on the other surface of the substrate body 11. The pad 12 is one example of a first pad according to an embodiment of the present invention. The pad 13 is one example of a second pad according to an embodiment of the present invention.

The pad 12 and the pad 13 are electrically connected by way of the through wiring 14. The through wiring 14 may be formed by filling the through hole 11x with, for example, a conductive material. The pad 12 functions as a pad that is connected to a fixing part 31 of the connection terminal 30A. The pad 13 functions as a pad that is connected to the fixing part 31 of the connection terminal 30B. Each of the pad 12 and the pad 13 may include a patterned portion having a predetermined flat shape (i.e. a portion that functions as a wiring pattern that is connected to the pad 12 or the pad 13).

The substrate body 11 is used as a base for fixing the position of the connection terminal 30. For example, a flexible film-like substrate formed of a polyimide resin or a liquid crystal polymer may be used as the substrate body 11. Alternatively, a rigid substrate (e.g., FR4 material) having an insulating resin (e.g., epoxy type resin) impregnated in glass cloth may be used as the substrate body 11. The thickness of the substrate body 11 may be, for example, approximately 0.3 mm to 4 mm.

For example, copper (Cu) may be used as the material of the pad 12, the pad 13, and the through wiring 14. The thickness of the pad 12 and the thickness of the pad 13 may be, for example, approximately 10 μm to 40 μm, respectively. The pad 12, the pad 13, and the through wiring 14 may be formed by using various wiring fabricating methods such as a semi-additive method or a subtractive method.

The connection terminal 30 is a conductive member having a spring-like property. The fixing part 31 of the connection terminal 30A, which is formed on one end (first end) of the connection terminal 30A, is electrically and mechanically connected to the pad 12 by way of the bonding part 20. A connection part 32 of the connection terminal 30A is formed on the other end (second end) of the connection terminal 30A. The connection part 32 of the connection terminal 30A, which contacts a pad 63 of the semiconductor package 4 in a detachable state (i.e. not fixed to the pad 63), is electrically connected to the pad 63.

Further, the fixing part 31 of the connection terminal 30B, which is formed on one end (first end) of the connection terminal 30B, is electrically and mechanically connected to the pad 13 by way of the bonding part 40. The connection part 32 of the connection terminal 30B is formed on the other end (second end) of the connection terminal 30B. The connection part 32 of the connection terminal 30B, which contacts a pad 72 of the mounting substrate 5 in a detachable state (i.e. not fixed to the pad 63), is electrically connected to the pad 72.

The connection terminal 30A and the connection terminal 30B may be arranged superposing each other from a plan view. The connection terminal 30A and the connection terminal 30B are electrically connected by way of the bonding part 20, the substrate 10, and the bonding part 40. The bonding part 20 is one example of a first bonding part according to an embodiment of the present invention. The bonding part 40 is one example of a second bonding part according to an embodiment of the present invention.

From a plan view, the connection terminals 30 (including the connection terminals 30A and 30B) are arranged to be inclined a predetermined angle $\theta_1$ with respect to an arrangement direction C (X-direction) in which the connection terminals 30 are arranged (see, for example, FIG. 3). The predetermined angle $\theta_1$ may be, for example, approximately 20 degrees to 60 degrees.

By having each of the connection terminals 30 inclined a predetermined angle $\theta_1$ with respect to the arrangement direction C, more connection terminals 30 can be arranged per unit area of the substrate 10 compared to a case where the connection terminals 30 are arranged parallel with respect to the arrangement direction C. Thereby, the connection terminals 30 can be connected to a connection target (e.g., semiconductor package 4) that has corresponding pads (e.g., pads 63) arranged with a narrow pitch (e.g., approximately 0.8 mm). The configuration of the connection terminal 30 is described in further detail below.

The bonding part 20 connects the fixing part 31 of the connection terminal 30A and the pad 12 both electrically and mechanically. The bonding part 40 connects the fixing part 31 of the connection terminal 30B and the pad 13 both electrically and mechanically. For example, a conductive material such as solder or a conductive resin paste (e.g., Ag paste) may be used as the material of the bonding parts 20 and 40. It is, however, preferable to use solder as the material of the bonding parts 20 and 40. This is because solder has more fluidity compared to the conductive resin paste and enables formation of the below-described uniform residual solder part when the connection terminals 30 are bonded to corresponding pads.

For example, an alloy including lead (Pb), an alloy including tin (Sn) and copper (Cu), an alloy including tin (Sn) and silver (Ag), or an alloy including tin (Sn), silver (Ag), and copper (Cu) may be used as the material of the bonding parts 20 and 40 in the case of using solder. Alternatively, an alloy including tin (Sn) and antimony (Sb), an alloy including tin (Sn), silver (Ag), copper (Cu), and antimony (Sb), or an alloy including tin (Sn), silver (Ag), bismuth (Bi) and indium (In) may be used as the material of the bonding parts 20 and 40.

Next, a structure of the connection terminal 30 is described in detail with reference to FIGS. 4A-4D. FIGS. 4A-4D are drawings for describing an example of the connection terminal 30 according to the first embodiment. More specifically, FIG. 4A is a front view of the connection terminal 30 according to the first embodiment, FIG. 4B is a left side view of the connection terminal 30 according to the first embodiment, FIG. 4C is a right side view of the connection terminal 30 according to the first embodiment, and FIG. 4D is a bottom view of the connection terminal 30 according to the first embodiment.

With reference to FIG. 4, the connection terminal 30, which is a conductive member having a spring-like property, includes the fixing part 31, the connection part 32, a spring part 33, a first support part 34, and a second support part 35. For example, the connection terminal 30 may have a nickel (Ni) plating film formed on a metal surface that is mainly constituted by a copper (Cu) type alloy. In addition, it is preferable to form a layered structure in the fixing part 31 and a contact part 38 (described below) of the connection terminal 30 by further forming a gold (Au) plating film on the Ni plating film, so that wettability and connection reliability of solder can be improved.

As illustrated in FIG. 4A, the fixing part 31 is formed on the one end of the connection terminal 30. The fixing part 31 has a planar shape. The thickness of the fixing part 31 may be, for example, approximately 0.08 mm. The horizontal width (depth direction in FIG. 4A) of the fixing part 31 may be, for example, approximately 0.3 mm. The vertical width (horizontal direction in FIG. 4A) of the fixing part 31 may be, for example, approximately 0.4 mm.

The fixing part 31 of the connection terminal 30A includes a first surface 31a that faces the pad 12. The first surface 31a of the fixing part 31 of the connection terminal 30A is electrically and mechanically connected to an upper surface of the pad 12 of the substrate 10 by way of the bonding part 20. The fixing part 31 of the connection terminal 30B includes a first surface 31a that faces the pad 13. The first surface 31a of the fixing part 31 of the connection terminal 30B is electrically and mechanically connected to a lower surface of the pad 13 of the substrate 10 by way of the bonding part 40. The connection terminal 30A is one example of a first connection terminal according to an embodiment of the present invention. The connection terminal 30B is one example of a second connection terminal according to an embodiment of the present invention.

The connection part 32 is formed on the other end of the connection terminal 30. The connection part 32 is positioned opposite from the fixing part 31. The connection part 32 is electrically connected to the fixing part 31 by way of the spring part 33, the first support part 34, and the second support part 35. The connection part 32 includes the contact part 38 and a projecting part 39. The thickness of the connection part 32 may be, for example, approximately 0.08 mm. The horizontal width (depth direction in FIG. 4A) of the connection part 32 may be, for example, approximately 0.2 mm. It is to be noted that the spring part 33, the first support part 34, and the second support part 35 as a whole may be referred as a "curved part" of the connection terminal 30. In other words, the connection terminal 30 has the fixing part 31 positioned opposite from the connection part 32 by way of the curved part having a spring-like property.

The contact part 38 is a part of the connection part 32 that contacts a pad of a connection target (e.g., the pad 63 of the semiconductor package 4, the pad 72 of the mounting substrate 5). The contact part 38 has a round shape (e.g., a semicircular curved shape). The contact part 38 mainly moves in the Z-direction of FIG. 1 in a case where a pressing force is exerted to the connection terminal 30. By forming the contact part 38 with a round shape, the contact part 38 can prevent the pad of the connection target from being damaged when the contact part 38 has the pressing force applied and is forced to contact the pad of the connection target.

Further, in the case where the pressing force is exerted on the connection terminal 30, the spring part 33 deforms in correspondence with the pressing force and causes the connection part 32 to move toward the fixing part 31 (Z-direction of FIG. 1). In this state where the connection part 32 is moved toward the fixing part 31, the contact part 38 contacts the pad of the connection target. Therefore, when the pad of the connection target contacts the connection part 32, the connection part 32 can be prevented from significantly moving in a direction parallel to a surface on which the pad of the connection target is formed. Therefore, the pads of the connection target can be arranged with a narrow pitch. The pitch of the pads of the connection target (pitch of the contact parts 38) may be, for example, approximately 0.8 mm.

The projecting part 39 has one end integrally formed with the second support part 35 and another end integrally formed with the contact part 38. The projecting part 39 projects from the second support part 35 in a direction toward the pad of the connection target (direction separating from the fixing part 31).

The following effect can be attained by providing the projecting part 39 between the contact part 38 and the second support part 35 in a manner that the projecting part 39 projects from the second support part 35 in a direction toward the pad of the connection target (direction separating from the fixing part 31) and is integrally formed with the contact part 38 and the second support part 35. That is, in a case where a pressing force is exerted on the contact part 38, the pad of the connection target and the second support part 35 can be prevented from being forced to contact each other by the deformation of the spring part 33. As a result, the connection terminal 30 and the pad of the connection target can be prevented from being damaged.

In a state where the pad of the connection target and the connection part 32 are not contacting each other, a projecting amount D of the connection part 32 (i.e. the amount in which the connection part 32 projects with respect to a joint part between the second support part 35 and the projecting part 39 (see FIG. 4A)) may be, for example, 0.3 mm.

The spring part 33 is provided between the first support part 34 and the second support part 35. The spring part 33 is integrally formed with the first support part 34 and the second support part 35. The spring part 33 has a curved shape (e.g., C-shape). The spring part 33 has a spring-like property (elastic property).

The spring part 33 causes the connection part 32 to be forced by repulsion in a direction toward the pad of the connection target when a pressing force is exerted on the connection part 32. Thereby, the connection part 32 can contact the pad of the connection target without having to fix the connection part 32 and the pad of the connection target to each other. The horizontal width (depth direction in FIG. 4A) and the thickness of the spring part 33 may be, for example, substantially the same as the horizontal width and the thickness of the connection part 32.

With the connection terminal 30 of the first embodiment, the first support part 34, the spring part 33, the second support part 35, and the connection part 32 combined as a united body actually provide a function of a spring (spring-like property). A portion of the connection terminal 30 that corresponds to the first support part 34, the spring part 33, the second support part 35, and the connection part 32 may have a spring constant of, for example, 0.6 N/mm to 0.8 N/mm.

The first support part 34 is provided between the spring part 33 and the fixing part 31. One end of the first support part 34 is integrally formed with one end of the spring part 33 whereas the other end of the first support part 34 is integrally formed with the fixing part 31. The first support part 34 has a planar shape.

The first support 34 is formed, so that an angle $\theta_2$ formed by a plane E including the first surface 31a of the fixing part 31 and a surface 34a of the first support part 34 becomes an acute angle. The angle $\theta_2$ may be, for example, 5 to 15 degrees.

Accordingly, by forming the angle $\theta_2$ into an acute angle, the substrate 10 and the first support part 34 can be prevented from being forced to contact each other by the deformation of the spring part 33 in a case where a pressing force is exerted on the contact part 38. Thereby, the connection terminal 30 and the substrate 10 can be prevented from being damaged. The horizontal width (depth direction in FIG. 4A) and the thickness of the first support part 34 may be, for example, substantially the same as the horizontal width and the thickness of the connection part 32.

The second support part 35 is provided between the spring part 33 and the connection part 32. One end of the second support part 35 is integrally formed with the other end of the spring part 33 whereas the other end of the second support part 35 is integrally formed with the projecting part 39 of the connection part 32. The second support part 35 has a planar shape. The horizontal width (depth direction in FIG. 4A) and the thickness of the second support part 35 may be, for example, substantially the same as the horizontal width and the thickness of the connection part 32. In a state where no pressing force is applied to the connection part 32 as illustrated in FIGS. 4A-4D, a height H of the connection terminal 30 may be, for example, approximately 1 mm to 2 mm.

A groove 30x is formed in a surface of the fixing part 31 and the bent part (i.e. the spring part 33, the first support part 34, and the second support part 35) that face the pad (the pad 12 or the pad 13) of the substrate 10. That is, the groove 30x is formed in a part of the surface of the connection terminal 30 that faces the pad (pad 12 or pad 13) of the substrate 10 and extends from the first surface 31a of the fixing part 31 to the connection part 32.

In other words, the groove 30x extends from the first surface 31a of the fixing part 31 to the connection part 32. It is, however, to be noted that the groove 30x need only be continuously formed from the first surface 31a of the fixing part 31 to a part of the bent part. That is, the groove 30x does not need to be formed in the entire area of the fixing part 31 and the bent part of the connection terminal 30. The surface of the fixing part 31 and the surface of the bent part (i.e. the spring part 33, the first support part 34, and the second support part 35) that face the pad (pad 12 or pad 13) of the substrate 10 that face the pad (the pad 12 or the pad 13) may also be hereinafter referred to as "pad facing surface". That is, the pad facing surface includes the first surface 31a of the fixing part 31, an outer surface 33a of the spring part 33, an outer surface 34a of the first support part 34, and an outer surface 35a of the second support part 35 as illustrated in FIG. 4A.

In this embodiment, the groove 30x is a single groove extending in a longitudinal direction of the connection terminal 30 (i.e. direction extending from the first surface 31a of the fixing part 31 to the connection part 32) and having a substantially straight linear shape. The cross section of the groove 30x may be, for example, a triangular shape. Alternatively, the cross section of the groove 30x may be, for example, a rectangular shape or a semi-circular shape, or a semi-elliptical shape. The width of the groove 30x may be, for example, approximately 0.01 mm to 0.05 mm. The depth of the groove 30x may be, for example, approximately 0.01 mm to 0.05 mm.

In a case where the connection terminal 30A is bonded to the pad 12 of the substrate 10 by using solder as the bonding part 20, the groove 30x functions as a guiding groove that allows molten solder to flow evenly. Likewise, in a case where the connection terminal 30B is bonded to the pad 13 of the substrate 10 by using solder as the bonding part 40, the groove 30x functions as a guiding groove that allows molten solder to flow evenly.

Although molten solder forms the bonding part 20 and the bonding part 40, a portion of the molten solder may become residual solder and may be forced to flow along the groove 30x by capillary action. Thereby, a residual solder part 25 is formed along the groove 30x as illustrated in FIGS. 5A and 5B. The residual solder part 25 fills the inside of the groove 30x and projects from the groove 30x toward the pad (the pad 12 or the pad 13) of the substrate 10. The thickness T of the residual solder part 25 (i.e. amount by which the residual solder part 25 projects from the pad facing surface of the connection terminal 30) may be, for example, approximately 20 μm to 40 μm.

Although it is possible for a residual solder part to be formed even in a case where the groove 30x is not formed, it would be difficult for residual solder to spread throughout a wide area due to the absence of the guiding groove function for causing the residual solder to flow. Thereby, the shape of the residual solder part or the amount of solder constituting the residual solder part may vary (inconsistencies among residual solder parts) depending on the connection terminal to which the residual solder part is formed. For example, in a case where the groove 30x is not formed in the connection terminal 30, the inconsistency of the thicknesses of residual solder part 25 may be, approximately 20 μm to 80 μm.

On the other hand, in a case where the groove 30x is formed, residual solder can flow in a wide area along the groove 30x owing to the guiding groove function for enabling the residual solder to evenly flow in the groove 30x. Thereby, the residual solder part 25 having an even shape (even thickness and width) can be formed. As a result, the inconsistency of the thicknesses T of the residual solder part 25 in a case of forming the groove 30x can be controlled to be a small amount compared to the inconsistency of the thicknesses T of the residual solder part 25 in a case of not forming the groove 30x. Accordingly, the inconsistency of the thicknesses of the residual solder part 25 may be approximately 20 μm to 40 μm. Hence, by providing the groove 30x that continuously extends from the first surface 31a of the fixing part 31 to the portion of the bent part of the connection terminal 30, the residual solder part 25 can be formed having an even shape along the groove 30x.

By forming a metal plating film in an area of the pad facing surface of the connection terminal 30 having the groove 30x formed therein, the wettability of solder can be improved, and the flow of residual solder becomes more satisfactory. Therefore, it is preferable to form a metal plating film in an area of the pad facing surface of the connection terminal 30 having the groove 30x formed therein.

For example, the connection terminal 30 may be manufactured as follows.

A metal plate (not illustrated) made of a copper (Cu) type alloy is prepared. Then, the metal plate is formed into a predetermined shape by performing a punching process on the metal plate. For example, the metal plate may be punched into an elongated shape. At the same time of performing the punching process, the groove 30x may be formed in a portion of the metal plate that corresponds to the fixing part 31 and the bent part (the spring part 33, the first support part 34, and the second support part 35).

Then, after performing the punching process on the metal plate, a nickel (Ni) plating film having a thickness of, for example, approximately, 1 μm to 3 μm is formed on the entire surface of the metal plate. Then, a gold (Au) plating film having a thickness of, for example, approximately, 0.3 μm to 0.5 μm is formed on a part of the Ni plating film. More specifically, the gold plating film is layered on a portion of the Ni plating film corresponding to the fixing part 31 and the contact part 38 and a portion of the Ni plating film in which the groove 30x is formed. Then, after forming the Ni and Au plating films on the metal plate, a bending process is performed on the metal plate. Thereby, the manufacturing of the connection terminal 30 is completed.

The Cu type alloy used as the material of the metal plate may be, for example, phosphor bronze, beryllium copper, or a Corson type copper alloy. Alternatively, the connection terminal may be manufactured by etching a metal plate (e.g., Cu type alloy) (not illustrated) into a predetermined shape and bending the etched metal plate. During the etching process, the groove 30x may be formed by performing half-etching on a portion corresponding to the fixing part 31 and the bent part (the spring part 33, the first support part 34, and the second support part 35) of the connection terminal 30. (Retaining structure 3, semiconductor package 4, and mounting substrate 5)

First, the semiconductor package 4 and the mounting substrate 5 that are retained by the retaining structure 3 are described. The semiconductor package 4 is one example of a contact target according to an embodiment of the present invention. The semiconductor package 4 includes a substrate 61, a semiconductor chip 62, a pad(s) 63, and a heat radiation plate 64. It is, however, to be noted that the heat radiation plate 64 may be provided in the semiconductor package 4 according to necessity. For example, the substrate 61 may include a substrate body containing an insulating resin and having an insulating layer, a wiring pattern, and a through wiring or the like (not illustrated) formed therein. The substrate 61 includes upper and lower surfaces. The semiconductor chip 62 which contains silicon or the like is mounted on the upper surface of the substrate 61. The pad 63 which is a part of the wiring pattern is formed on the lower surface of the substrate 61.

The pads 63 are arranged on the lower surface of the substrate 61, for example, in a matrix-like manner. That is, the semiconductor package 4 is a so-called Land Grid Array (LGA). Thus, the socket 1 according to an embodiment of the present invention is a socket used for LGA. For example, copper (Cu) may be used as the material of the pad 63. The thickness of the pad 63 may be, for example, approximately 5 μm to 10 μm. The semiconductor chip 62 is mounted on the substrate 61 by, for example, flip-chip bonding. The heat radiation plate 64 formed of metal (e.g., copper) is provided on the semiconductor chip 62. It is to be noted that, an encapsulation resin may be provided, for example, in the periphery of the semiconductor chip 62.

The mounting substrate 5 (e.g., motherboard) includes a substrate body 71 and a pad(s) 72 which is a part of a wiring pattern. The substrate body 71 may be, for example, a substrate having an insulating resin (e.g., epoxy type resin) impregnated in glass cloth. The pads 72 are arranged on an upper surface of the substrate 71, for example, in a matrix-like manner in correspondence with the positions of the pads 63 of the semiconductor package 4. For example, copper (Cu) may be used as the material of the pad 72.

The mounting substrate 5 includes through-holes 71x to which corresponding bolts 51a are to be inserted. The through-holes 71x are formed in the vicinity of four corners of the mounting substrate 5 from a plan view. A plurality of through-holes 71y are formed at predetermined intervals. The plurality of through-holes 71 are positioned in an area that is outside a pad forming area (an area at which the pad 72 is formed) of the mounting substrate 5 but inside a through-hole forming area (an area at which the through-hole 71x is formed) of the mounting substrate 5. The through-hole 71y is a guiding hole to which a below-described protruding part 84 of a positioning part 52 is inserted.

Next, the retaining structure 3 is described. The retaining structure 3 includes the rear fixing plate 51, the positioning part 52, a pressing plate 53, a spacer 54, and a nut 55. The retaining structure 3 functions to retain a certain position for the interposer 2 and the semiconductor package 4 with respect to the mounting substrate 5.

A plan-view shape of the rear fixing plate 51 is, for example, a substantially rectangular shape. The rear fixing plate 51 may be metal plate including an insulated surface and having the bolts 51a erected in the vicinity of the four corners of the rear fixing plate 51. The bolt 51a is formed with a length that allows the bolt 51a to project from an upper surface of the pressing plate 53 when the pressing plate 53 is provided on the semiconductor package 4. For example, steel, stainless steel (SUS), or aluminum may be used as the metal plate constituting the rear fixing plate 51. Each bolt 51a of the rear fixing plate 51 is inserted into the corresponding through-hole 71x of the mounting substrate 5. Thereby, the mounting substrate 5 is positioned on the rear fixing plate 51.

The interposer 2 and the semiconductor package 4 are positioned on the mounting substrate 5 by the positioning part 52. More specifically, the positioning part 52 positions the interposer 2 and the semiconductor package 4, so that the connection part 32 of the connection terminal 30A detachably contacts the pad 63 of the semiconductor package 4 and the connection part 32 of the connection terminal 30B detachably contacts the pad 72 of the mounting substrate 5.

Next, a structure of the positioning part 52 according to an embodiment of the present invention is described with reference to FIGS. 6A-6C. FIG. 6A is a plan view of the positioning part 52 according to the first embodiment. FIG. 6B is a cross-sectional view taken along line A-A of FIG. 6A according to the first embodiment. FIG. 6C is a cross-sectional view taken along line B-B of FIG. 6A according to the first embodiment.

With reference to FIG. 6A, the positioning part 52 includes a frame-like member 81 having a substantially rectangular-shaped opening provided at the center of the frame-like member 81. A position retaining part 82, a position retaining part 83, and the protruding part 84 are provided in the frame-like member 81. The positioning part 52 is formed of, for example, a resin material or a metal material. The positioning part 52 functions to align the positions of the interposer 2 and the semiconductor package 4 by positioning the interposer 2 and the semiconductor package 4 and retaining the positions of the interposer 2 and the semiconductor package 4.

Further, the positioning part 52 functions to prevent a space between the substrate 10 of the interposer 2 and the substrate body 71 of the mounting substrate 5 from becoming less than or equal to a predetermined threshold. Further, the positioning part 52 functions to prevent a space between the substrate 61 of the semiconductor package 4 and the substrate body 71 of the mounting substrate from becoming less than or equal to a predetermined threshold.

The position retaining part 82 includes a pedestal part 82a having a substantially semi-circular shape from a plan view and a columnar part 82b having a substantially circular shape from a plan view. In this embodiment, two position retaining parts 82 are provided, at predetermined intervals, in each of a first pair of sidewalls of the frame-like member 81 that face each other. The pedestal part 82a and the columnar part 82b are provided to partly project inward from the sidewalls of the frame-like member 81 from a plan view.

A lower surface of the pedestal part 82a is substantially flush with a lower surface 81a of the frame-like member 81. An upper surface of the pedestal part 82a is positioned lower than an upper surface 81b of the frame-like member 81. The columnar part 82b is provided on an upper surface of the pedestal part 82a. An upper surface of the columnar part 82b is positioned higher than the upper surface 81b of the frame-like member 81.

The position retaining member 83 includes a pedestal part 83a having a substantially semi-circular shape from a plan view and a columnar part 83b having a substantially circular shape from a plan view. In this embodiment, two position retaining parts 83 are provided, at predetermined intervals, in each of a second pair of sidewalls of the frame-like member 81 that face each other (pair of sidewalls of the frame-like member 81 to which the position retaining members 82 are not provided). The pedestal part 83a and the columnar part 83b are provided to partly project inward from the sidewalls of the frame-like member 81 from a plan view.

A lower surface of the pedestal part 83a is substantially flush with the lower surface 81a of the frame-like member 81. An upper surface of the pedestal part 83a is positioned lower than an upper surface 81b of the frame-like member 81 but higher than an upper surface of the pedestal part 82a. In other words, the upper surface of the pedestal part 83a is positioned one level higher than the upper surface of the pedestal part 82a.

The columnar part 83b is provided on the upper surface of the pedestal part 83a. The upper surface of the columnar part 83b is positioned higher than the upper surface 81b of the frame-like member 81. In other words, a portion of the columnar part 83b projects from the upper surface 81b of the frame-like member 81. The upper surface of the columnar part 83b is substantially flush with the upper surface of the columnar part 82b.

A plurality of the protruding parts 84 are provided, at predetermined intervals, at an outer edge part of the lower surface 81a of the frame-like member 81. A plan-view shape of the protruding part 84 is smaller than a plan-view shape of the through-hole 71y of the mounting substrate 5. The protruding part 84 is inserted into the through-hole 71y of the mounting substrate 5. Thereby, the positioning part 52 is positioned with respect to the mounting substrate 5.

As illustrated in FIG. 3, two substantially semicircular shaped notch parts 10x are provided, at predetermined intervals, in each of a first pair of side edge parts of the substrate 10 that face each other. Further, two substantially semicircular shaped notch parts 10y are provided, at predetermined intervals, in each of a second pair of side edge parts of the substrate 10 (pair of side edge parts of the substrate 10 to which the notch parts 10x are not provided). It is to be noted that the plan-view shape of the notch part 10y is larger than a plan-view shape of the notch part 10x.

The plan-view shape of the notch part 10x is formed larger than a plan-view shape of a portion of the columnar part 82b projecting inward from the sidewall of the frame-like member 81 but smaller than a plan-view shape of a portion of the pedestal part 82a projecting inward from the sidewall of the frame-like member 81. Further, the plan-view shape of the notch part 10y is formed larger than a plan-view shape of a portion of the pedestal part 83a projecting inward from the sidewall of the frame-like member 81.

The substrate 10 of the interposer 2 is arranged within the frame-like member 81, so that the notch part 10x is positioned in correspondence with the portion of the columnar part 82b projecting inward from the sidewall of the frame-like member 81 and the notch part 10y is positioned in correspondence with the portion of the pedestal part 83a projecting inward from the sidewall of the frame-like member 81.

As described above, the plan-view shape of the notch part 10x is formed smaller than the plan-shape of the portion of the pedestal part 82a projecting inward from the sidewall of the frame-like member 81. Therefore, the pedestal part 82a functions as a stopper to prevent the substrate 10 of the interposer 2 from being pressed further toward the mounting substrate 5 than the upper surface of the pedestal part 82a.

In other words, the interposer 2 maintains the outer edge part of the lower surface of the substrate 10 in a position contacting the upper surface of the pedestal part 82a or in a position floating slightly above the upper surface of the pedestal part 82a by the spring-like property of the connection terminal 30B. As a result, the substrate 10 of the interposer 2 can be prevented from being excessively pressed toward the mounting substrate 5, and the connection terminal 30B can be prevented from being damaged by excessive deformation. Thereby, the connection terminal 30B can be prevented from being damaged.

Notch parts corresponding to the notch parts 10x and 10y are also provided in the substrate 61 of the semiconductor package 4 (although not illustrated in the drawings, the notch parts of the substrate 61 are hereinafter referred to as notch parts 61*x* and 61*y* for the sake of convenience). A plan-view shape of the notch part 61*x* is formed larger than the plan-view shape of the portion of the columnar part 82*b* projecting inward from the sidewall of the frame-like member 81. Further, a plan-view shape of the notch part 61*y* is formed larger than the plan-view shape of the portion of the columnar part 83*b* projecting inward from the sidewall of the frame-like member 81 but smaller than the plan-view shape of the portion of the pedestal part 83*a* projecting inward from the sidewall of the frame-like member 81.

The substrate 61 of the semiconductor package 4 is arranged within the frame-like member 81, so that the notch part 61*x* is positioned in correspondence with the portion of the columnar part 82*b* projecting inward from the sidewall of the frame-like member 81 and the notch part 61*y* is positioned in correspondence with the portion of the columnar part 83*b* projecting inward from the sidewall of the frame-like member 81.

As described above, the plan-view shape of the notch part 61*y* is formed smaller than the plan-shape of the portion of the pedestal part 83*a* projecting inward from the sidewall of the frame-like member 81. Therefore, the pedestal part 83*a* functions as a stopper to prevent the substrate 61 of the semiconductor package 4 from being pressed further toward the interposer 2 than the upper surface of the pedestal part 83*a*.

In other words, the semiconductor package 4 maintains the outer edge part of the lower surface of the substrate 61 in a position contacting the upper surface of the pedestal part 83*a* or in a position floating slightly above the upper surface of the pedestal part 83*a* by the spring-like property of the connection terminal 30A. As a result, the substrate 61 of the semiconductor package 4 can be prevented from being excessively pressed toward the interposer 2, and the connection terminal 30A can be prevented from being damaged by excessive deformation. Thereby, the connection terminal 30A can be prevented from being damaged.

The pressing plate 53 is a member that presses the interposer 2 and the semiconductor package 4 toward the mounting substrate 5. The pressing plate 53 is provided on the spacer 54 that is provided on the mounting substrate 5 in a state where the bolt 51*a* is inserted thereto. The pressing plate 53 is fixed to the rear fixing plate 51 by way of the nut 55 fastened to an upper end part of the bolt 51*a*. Through-holes for avoiding, for example, the semiconductor chip 62, the heat radiation plate 64, and the bolt 51*a* are formed in the pressing plate 53, so that a predetermined area of a lower surface of the pressing plate 53 can contact the upper surface of the substrate 61 of the semiconductor package 4 and the upper surface of the spacer 54.

When the pressing plate 53 is fixed to the rear fixing plate 51 in a state where the predetermined area of the lower surface of the pressing plate 53 is contacting the upper surface of the substrate 61 of the semiconductor package 4, the pressing plate 53 presses the semiconductor package 4 toward the mounting substrate 5 and moves the semiconductor package 4 toward the mounting substrate 5.

Accordingly, a pressing force is exerted on the connection terminals 30A and 30B of the socket 1 and causes the connection terminals 30A and 30B to contract in the Z-direction and generate a predetermined spring force. Thereby, the pad 63 of the semiconductor package 4 contacts the connection part 32 of the connection terminal 30A, and the pad 72 of the mounting substrate 5 contacts the connection part 32 of the connection terminal 30B. In other words, the semiconductor package 4 is electrically connected to the mounting substrate 5 by way of the socket 1. It is, however, to be noted that the interposer 2 and the semiconductor package 4 can be detached from the socket 1 by removing the nut 55.

In the above-described first embodiment, the connection terminal 30 is provided with the groove 30*x* that continuously extends from the first surface 31*a* of the fixing part 31 to the portion of the bent part of the connection terminal 30. Because the groove 30*x* functions as a guiding groove that allows residual solder to flow evenly, residual solder can flow in a wide area along the groove 30*x*. Thereby, the residual solder part 25 having an even shape (even thickness and width) can be formed. As a result, the varying of spring constant with respect to each connection terminal 30 or the varying of the height from a surface of the substrate 10 to a tip of the connection terminal 30 may be prevented. Thus, connection reliability between the connection terminal 30 and the connection target can be improved.

By forming the residual solder part 25 in the connection terminal 30, the conductivity of the connection terminal 30 increases in a high frequency range of the connection terminal 30 (e.g., 10 GHz or higher) and insertion loss (S21) (see FIG. 12*b*) can be improved. That is, the electric characteristics of the connection terminal 30 can be improved. Because the residual solder part 25 is formed having an even shape, electric characteristics among the connection terminals 30 can be prevented from varying. The improvement of electric characteristics of the connection terminal 30 is explained in further detail in the below-described "Simulation".

(Second Embodiment)

Next, a socket 7 according to a second embodiment of the present invention is described. In the socket 7 of the second embodiment, a connection terminal structure 8 is provided instead of the interposer 2. In the second embodiment, like components are denoted with like reference numerals as those of the first embodiment and are not further explained.

Figure 7:
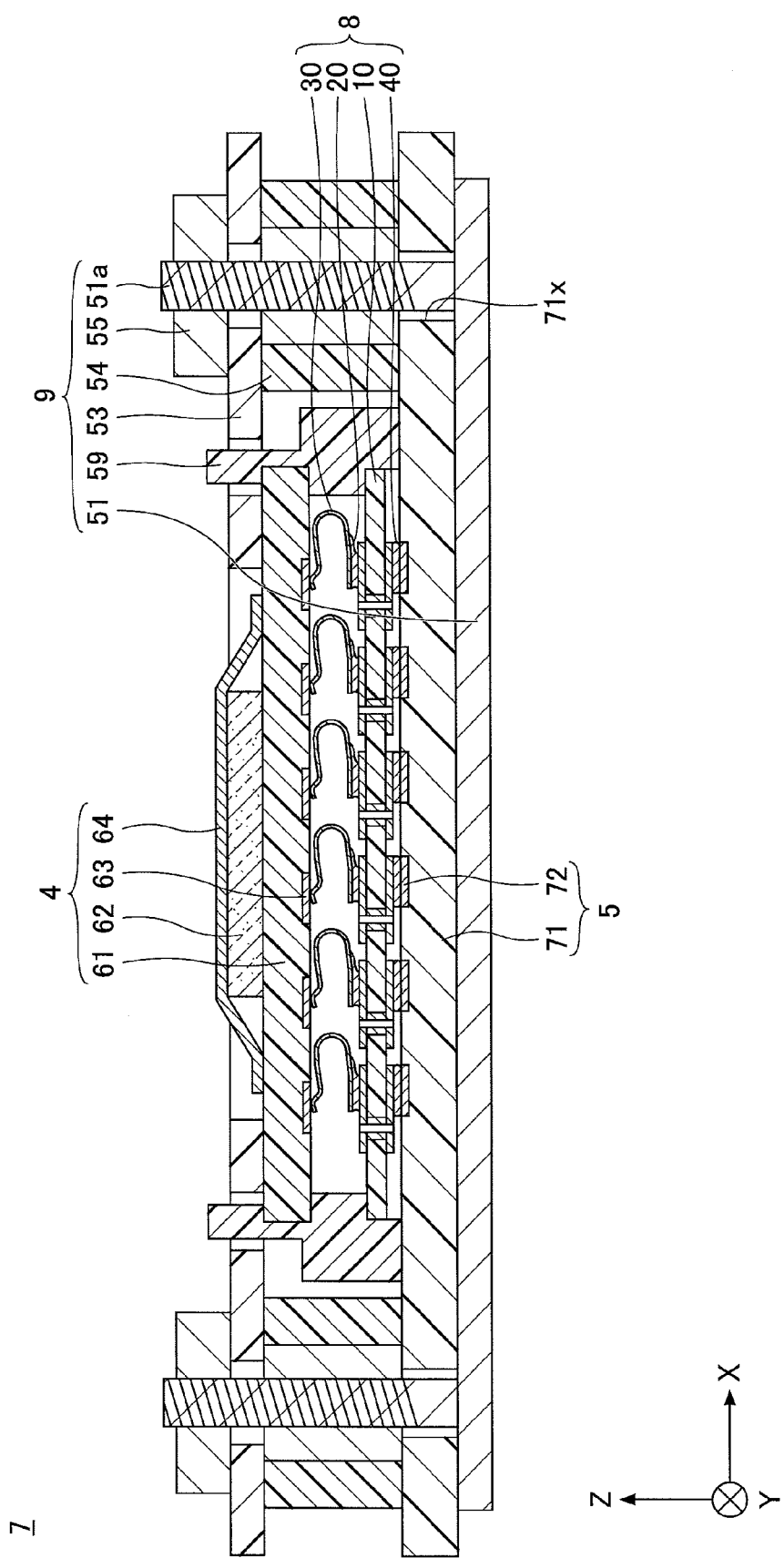
FIG. 7 is a cross-sectional view illustrating an example of a socket according to a second embodiment.
Figure 8:
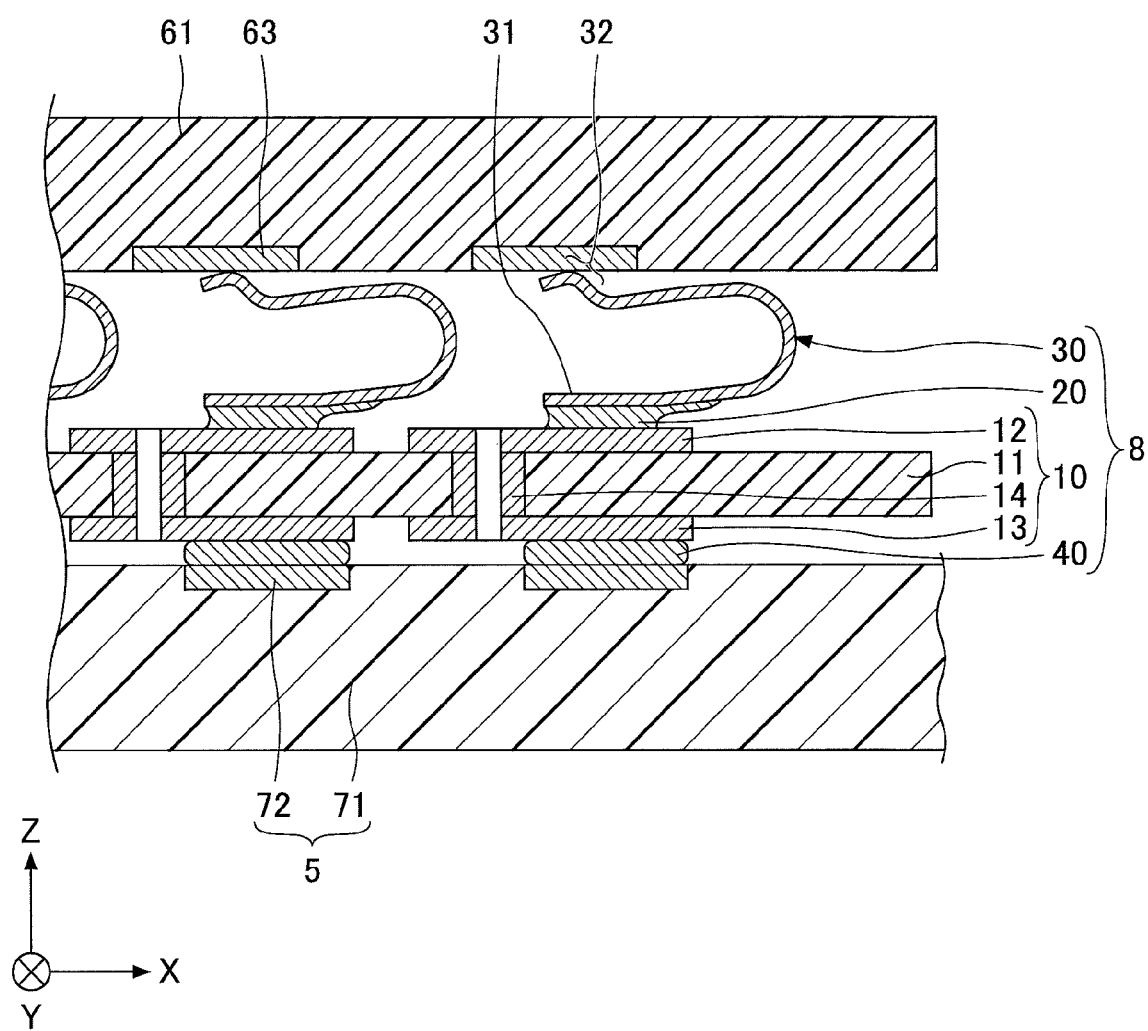
FIG. 8 is an enlarged view of a portion of FIG. 7.

FIG. 7 is a cross-sectional view illustrating an example of the socket 7 according to the second embodiment of the present invention. FIG. 8 is an enlarged view of a portion of FIG. 7. With reference to FIGS. 7 and 8, the differences between the socket 7 and the socket 1 (see, for example, FIG. 1) are that the interposer 2 is replaced with the connection terminal structure 8 and that the retaining structure 3 is replaced with a retaining structure 9.

In the connection terminal structure 8, the fixing part 31 of the connection terminal 30, which is formed on one end (first end) of the connection terminal 30, is electrically and mechanically connected to the pad 12 by way of the bonding part 20. The connection part 32 of the connection terminal 30 is formed on the other end (second end) of the connection terminal 30. The connection part 32 of the connection terminal 30, which contacts a pad 63 of the semiconductor package 4 in a detachable state (i.e. not fixed to the pad 63), is electrically connected to the pad 63.

The pad 13 is electrically connected to the pad 72 of the mounting substrate 5 by way of the bonding part 40. That is, in the connection terminal structure 8, the connection terminal 30 is provided only on one surface of the substrate 10, and the mounting substrate 5 is fixed to the other surface of the substrate 10. In other words, in the socket 7, only the semiconductor package 4 is detachable.

The retaining structure 9 is different from the retaining structure 3 (see, for example, FIG. 1) in that the positioning part 52 is replaced with a positioning part 59. The semiconductor package 4 is positioned on the mounting substrate 5 by the positioning part 59. More specifically, the positioning part 59 positions the semiconductor package 4, so that the connection part 32 of the connection terminal 30 contacts the pad 63 of the semiconductor package 4 in a detachable state with respect to the pad 63.

Next, a structure of the positioning part 59 according to an embodiment of the present invention is described with reference to FIGS. 9A-9C. FIG. 9A is a plan view of the positioning part 59 according to the second embodiment. FIG. 9B is a cross-sectional view taken along line A-A of FIG. 9A according to the second embodiment. FIG. 9C is a cross-sectional view taken along line B-B of FIG. 9A according to the second embodiment.

With reference to FIG. 9A, the positioning part 59 includes a frame-like member 91 having a substantially rectangular-shaped opening provided at the center of the frame-like member 91. A position retaining part 92 and a protruding part 94 are provided in the frame-like member 91. The positioning part 59 is formed of, for example, a resin material or a metal material. The positioning part 59 functions to align the positions of the connection terminal structure 8 and the semiconductor package 4 by positioning the connection terminal structure 8 and the semiconductor package 4 and retaining the positions of the connection terminal structure 8 and the semiconductor package 4. Further, the positioning part 59 functions to prevent a space between the substrate 61 of the semiconductor package 4 and the substrate 10 of the connection terminal structure 8 from becoming less than or equal to a predetermined threshold.

The position retaining part 92 includes a pedestal part 92a having a substantially rectangular shape from a plan view and a columnar part 92b having a substantially circular shape from a plan view. In this embodiment, two position retaining parts 92 are provided, at predetermined intervals, in each sidewall of the frame-like member 91. Further, a pedestal part 93 having no columnar part 92b formed thereon is provided between the two position retaining parts 92 provided in each sidewall of the frame-like member 91. The pedestal part 92a and the columnar part 92b are provided to partly project inward from the sidewalls of the frame-like member 91 from a plan view.

A lower surface of the pedestal part 92a is substantially flush with a lower surface 91a of the frame-like member 91. An upper surface of the pedestal part 92a is positioned lower than an upper surface 91b of the frame-like member 91. The columnar part 92b is provided on an upper surface of the pedestal part 92a. An upper surface of the columnar part 92b is positioned higher than the upper surface 91b of the frame-like member 91.

A plurality of the protruding parts 94 are provided, at predetermined intervals, at the lower surface 91a of the frame-like member 91. The positioning part 59 is arranged, so that a lower surface of the protruding part 94 contacts an upper surface of the substrate body 71 of the mounting substrate 5. In the positioning part 51, an inner surface of the protruding part 94 contacts a side surface of the substrate 10 of the connection terminal structure 8, and the lower surface 91a of the frame-like member 91 and the lower surface of the pedestal part 92a contact an outer edge part of an upper surface of the substrate 10 of the connection terminal structure 8.

The height of the protruding part 94 (i.e. the amount by which the protruding part 94 protrudes with respect to the lower surface 91a) is determined by considering the thickness of the substrate 10 and the thickness of the bonding part 40. Therefore, even if the positioning part 59 is mounted on the mounting substrate 5, the bonding part 40 does not have a load applied from the positioning part 59.

Two substantially semicircular shaped notch parts are provided, at predetermined intervals, in each side edge part of the substrate 61 of the semiconductor package 4 (although not illustrated in the drawings, the notch parts of the substrate 61 are hereinafter referred to as notch parts 61z for the sake of convenience). The plan-view shape of the notch part 61z is formed larger than a plan-view shape of a portion of the columnar part 92b projecting inward from the sidewall of the frame-like member 91 but smaller than a plan-view shape of a portion of the pedestal part 92a projecting inward from the sidewall of the frame-like member 91.

The substrate 61 of the semiconductor package 4 is arranged within the frame-like member 91, so that the notch part 61z is positioned in correspondence with the portion of the columnar part 92b projecting inward from the sidewall of the frame-like member 91. As described above, the plan-view shape of the notch part 61z is formed smaller than the plan-shape of the portion of the pedestal part 92a projecting inward from the sidewall of the frame-like member 91. Therefore, the pedestal part 92a functions as a stopper to prevent the substrate 61 of the semiconductor package 4 from being pressed further toward the connection terminal structure 8 than the upper surface of the pedestal part 92a. Similar to the pedestal part 92a, the pedestal part 93 also functions as a stopper.

In other words, the semiconductor package 4 maintains the outer edge part of the lower surface of the substrate 61 in a position contacting the upper surface of the pedestal part 92a or in a position floating slightly above the upper surface of the pedestal part 92a by the spring-like property of the connection terminal 30. As a result, the substrate 61 of the semiconductor package 4 can be prevented from being excessively pressed toward the connection terminal structure 8, and the connection terminal 30 can be prevented from being damaged by excessively deformed. Thereby, the connection terminal 30 can be prevented from being damaged.

When the pressing plate 53 is fixed to the rear fixing plate 51 in a state where the predetermined area of the lower surface of the pressing plate 53 is contacting the upper surface of the substrate 61 of the semiconductor package 4, the pressing plate 53 presses the semiconductor package 4 toward the mounting substrate 5 and moves the semiconductor package 4 toward the mounting substrate 5.

Accordingly, a pressing force is exerted on the connection terminal 30 of the socket 7 and causes the connection terminal 30 to contract in the Z-direction and generate a predetermined spring force. Thereby, the pad 63 of the semiconductor package 4 contacts the connection part 32 of the connection terminal 30. In other words, the semiconductor package 4 is electrically connected to the mounting substrate 5 by way of the socket 7. It is, however, to be noted that the semiconductor package 4 can be detached from the socket 7 by removing the nut 55.

Similar to the first embodiment, the groove 30x is provided to the connection terminal 30 of the second embodiment. Therefore, similar to the socket 1 of the first embodiment, the socket 7 of the second embodiment can also attain an improved connection reliability between the connection terminal 30 and the connection target and an improved electric characteristics for the connection terminal 30.

(Modified Example of Groove Shape)

Next, modified examples of groove shapes that are different from the shape of the groove 30x (formed in the pad facing surface of the fixing part 31 and the bent part of the connection terminal 30) of the first and second embodiments are described. In the description and drawings of the modified examples, like components are denoted with like reference numerals as of those of the first and second embodiments and are not further explained.

FIGS. 10A-10D are drawings for describing a first modified example of a connection terminal 100. More specifically, FIG. 10A is a front view of the connection terminal 100 of the first modified example, FIG. 10B is a left side view of the connection terminal 100 of the first modified example, FIG. 10C is a right side view of the connection terminal 100 of the first modified example, and FIG. 10D is a bottom view of the connection terminal 100 of the first modified example. In the connection terminal 30 illustrated in FIGS. 4A-4D, a single groove 30x is formed in a longitudinal direction of the connection terminal 30 (direction from the first surface 31a of the fixing part 31 to the connection part 32). In the connection terminal 100 illustrated in FIGS. 10A-10D, two grooves 100x and 100y are arranged next to each other and formed in a longitudinal direction of the connection terminal 100. Even in a case where a plurality of grooves 100x, 100y are formed in the pad facing surface of a fixing part 31 and a bent part of the connection terminal 100, the same effects can be attained as those attained by the connection terminal 30 of the first embodiment.

FIGS. 11A-11D are drawings for describing a second modified example of a connection terminal 110. More specifically, FIG. 11A is a front view of the connection terminal 110 of the second modified example, FIG. 11B is a left side view of the connection terminal 110 of the second modified example, FIG. 11C is a right side view of the connection terminal 110 of the second modified example, and FIG. 11D is a bottom view of the connection terminal 110 of the second modified example. In the connection terminal 110 illustrated in FIGS. 11A-11D, a groove 110x is formed in a longitudinal direction of the connection terminal 110. The groove 110x includes a first groove part $110_{x1}$ formed in the longitudinal direction of the connection terminal 110 and a plurality of second groove parts $110_{x2}$ that separate in both directions (directions of both sides of the connection terminal 110) from a predetermined part(s) of the first groove part $110_{x1}$.

Although the second groove parts $110_{x2}$ are provided, at predetermined intervals, in four parts of the first groove part $110_{x1}$ according to the example illustrated in FIGS. 11A-11D, the second groove parts $110_{x2}$ may be provided in 1 to 3 parts of the first groove part $110_{x1}$, or 5 or more parts of the first groove part $110_{x1}$. Alternatively, although each the second groove parts $110_{x2}$ spreads in a direction from the fixing part 31 to the connection part 32 to form a V-letter shape, the shape of the second groove part $110_{x2}$ is not limited to the shape illustrated in FIGS. 11C and 11D. For example, a part of the second groove parts $110_{x2}$ that constitutes the V-letter shape may have a curved shape rather than a straight linear shape illustrated in FIGS. 11C and 11D.

Alternatively, one part of the second groove parts $110_{x2}$ constituting the V-letter shape and the other part of the second groove parts $110_{x2}$ constituting the V-letter shape may be formed alternatively at different parts of the first groove part $110_{x1}$ rather than being formed at the same part of the first groove part $110_{x1}$. Alternatively, a plurality of grooves having a figure similar to that of the groove 110x may be provided in the connection terminal 110.

Hence, even in a case where the first groove part $110_{x1}$ and a plurality of the second groove parts $110_{x2}$ separating in both directions from predetermined parts of the first groove part $110_{x1}$ are formed in the pad facing surface of the fixing part 31 and the bent part of the connection terminal 110, the same effects can be attained as those attained by the connection terminal 30 of the first embodiment.

(Simulation)

The influence that the thickness of the residual solder part has on the electric characteristics of the connection terminal has been simulated. More specifically, simulations have been performed on the connection terminal 30 having an Ni plating film formed entirely on a Cu type alloy surface in a case where the thickness T of the residual solder part 25 of the connection terminal (see FIG. 5) is 0 μm (a state where no residual solder part 25 is formed), 20 μm, and 40 μm. In the simulations, S parameters (reflection loss (S11) and insertion loss (S21)) are obtained in a case where the connection part 32 of the connection terminal 30 is assumed as an input (port 1), and the connection part 30, the bonding part 20 (solder), the pad 12, the through wiring 14, the pad 13, and the bonding part 40 (solder) are assumed as a signal path, and the pad 72 of the mounting substrate 5 is assumed as an output (port 2).

Figure 12A:
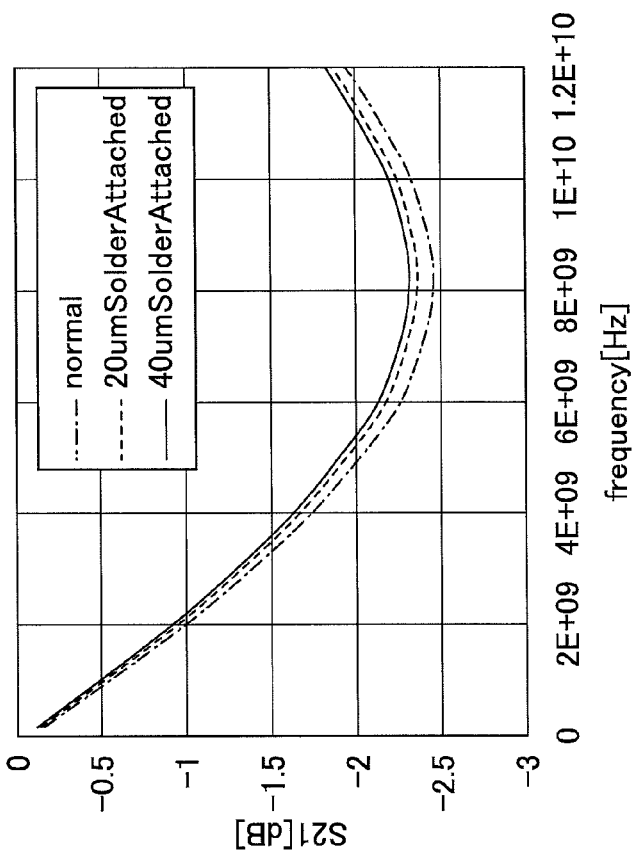
FIG. 12A illustrates simulation results pertaining to reflection loss (S11)
Figure 12B:
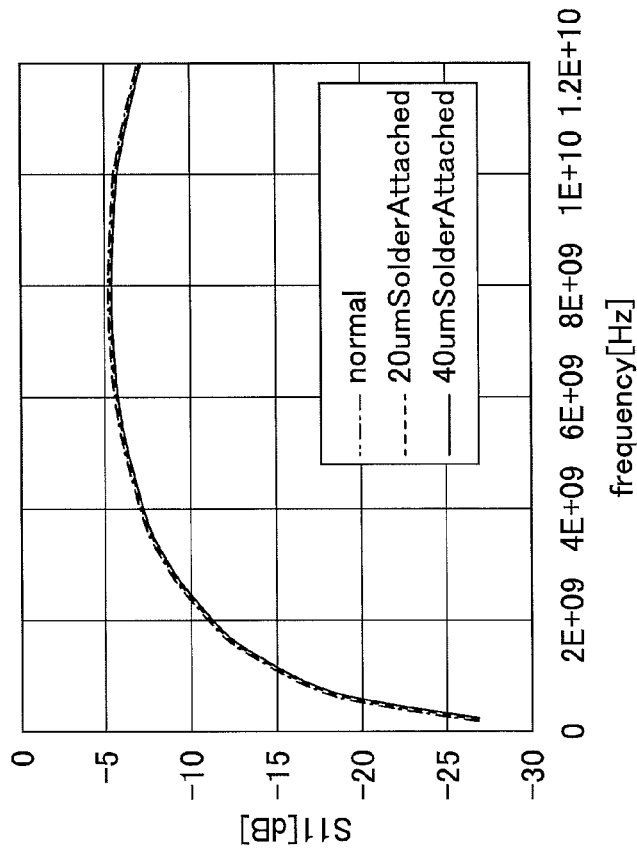
FIG. 12B illustrates simulation results pertaining to insertion loss (S21).

FIGS. 12A and 12B illustrate the results of the simulations. As illustrated in FIG. 12A, it has been learned that reflection loss (S11) is substantially constant regardless of the thickness T of the residual solder part 25. As illustrated in FIG. 12B, it has been learned that insertion loss (S21) improves as the thickness T of the residual solder part 25 increases.

Although the conductivity of solder is lower than Ni in a low frequency, Ni has high magnetic permeability. Therefore, as the frequency becomes a high frequency (e.g., 10 Ghz or higher), the conductivity of solder becomes higher than that of Ni (because the conductive cross sectional area is reduced by the influence of the skin effect, the conductivity of Ni decreases in the high frequency). Accordingly, the conductivity of the connection terminal 30 in the high frequency range increases as the thickness T of the residual solder part 25 increases. Thereby, insertion loss (S21) of the connection terminal 30 is improved.

Hence, it has been learned that preferable electric characteristics can be attained as the thickness of the residual solder part 25 increases. Accordingly, by forming the groove 30x in the connection terminal 30 and forming the residual solder part 25 with a uniform shape, the connection terminal 30 can attain improved electric characteristics in the high frequency range and prevent electric characteristics from varying among the connection terminals 30.

It is, however, to be noted that difficulties of mechanical characteristics (contact between the residual solder part 25 and the substrate 10) may occur in a case where the residual solder part 25 is too thick. Therefore, it is preferable to determine the thickness T of the residual solder part 25 by considering the electric characteristics and mechanical characteristics desired for the sockets 1, 7.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

For example, although the sockets 1 and 7 are applied to a mounting substrate such as a motherboard, in the above-described embodiments, the sockets 1 and 7 may be applied to a mounting substrate used for testing a semiconductor package (semiconductor package testing substrate). For example, characteristics such as electric characteristics of the semiconductor package can be repeatedly tested by using the socket 1 or 7 with the semiconductor package testing substrate.

What is claimed is:

1. A connection terminal structure comprising:
a substrate having one surface and including a pad formed on the one surface;
a bonding part constituted by a solder; and
a connection terminal having first and second ends and including a fixing part formed on the first end and a connection part formed on the second end;
wherein the fixing part includes a first surface that is bonded to the pad by way of the bonding part,
wherein the connection terminal includes a pad facing surface that faces the pad and includes the first surface,
wherein the connection terminal includes at least one groove that is formed in the pad facing surface,
wherein the at least one groove extends from the first surface to the connection part and forms an acute angle relative to the substrate,
wherein a portion of the solder that constitutes the bonding part fills in the at least one groove and another portion of the solder that constitutes the bonding part flows out from the at least one groove.

2. The connection terminal structure as claimed in claim 1, wherein the connection terminal further includes a bent part having a spring-like property,
wherein the connection part and the fixing part are positioned opposite to each other by way of the bent part,
wherein the at least one groove is continuously formed from the first surface to a part of the bent part.

3. The connection terminal structure as claimed in claim 1, wherein the portion of the solder projects toward the pad.

4. The connection terminal structure as claimed in claim 1, wherein the connection terminal includes a plurality of grooves that extend from the first surface to the connection part.

5. The connection terminal structure as claimed in claim 1, wherein the at least one groove includes a first groove part that extends from the first surface to the connection part and a plurality of second groove parts that separate in directions of both sides of the connection terminal from a predetermined part of the first groove part.

6. The connection terminal structure as claimed in claim 1, wherein a gold plating film is formed on the pad facing surface in which the at least one groove is formed.

7. The connection terminal structure as claimed in claim 1, wherein the connection terminal includes a metal plate that is bent and has an elongated shape.

8. The connection terminal structure as claimed in claim 1, wherein the substrate has another surface on which another pad electrically connected to the pad is formed.

9. The connection terminal structure as claimed in claim wherein the connection part is configured to contact a connection target.

10. An interposer comprising:
the connection terminal structure of claim 8;
another bonding part formed on the another pad; and
another connection terminal having a same configuration as the connection terminal;
wherein a fixing part of the another connection terminal is bonded to the another pad by way of the another bonding part.

11. A socket comprising:
the interposer of claim 10;
a connection target including a connection target pad;
a mounting substrate including a mounting substrate pad; and
a positioning part configured to position the interposer, so that the connection part of the connection terminal detachably contacts the connection target pad while the connection part of the another connection terminal detachably contacts the mounting substrate pad.

12. A socket comprising:
the connection terminal structure of claim 8;
a connection target including a connection target pad;
a mounting substrate bonded to the another pad; and
a positioning part configured to position the connection terminal structure, so that the connection part of the connection terminal detachably contacts the connection target pad.

* * * * *